United States Patent
Schlagenhaft (10) Patent No.: US 8,461,865 B2
(45) Date of Patent: Jun. 11, 2013

(54) LOGIC BUILT-IN SELF-TEST SYSTEM AND METHOD FOR APPLYING A LOGIC BUILT-IN SELF-TEST TO A DEVICE UNDER TEST

(75) Inventor: Rolf Schlagenhaft, Haar (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/126,854

(22) PCT Filed: Nov. 24, 2008

(86) PCT No.: PCT/IB2008/054921
§ 371 (c)(1),
(2), (4) Date: Apr. 29, 2011

(87) PCT Pub. No.: WO2010/058248
PCT Pub. Date: May 27, 2010

(65) Prior Publication Data
US 2011/0221469 A1 Sep. 15, 2011

(51) Int. Cl.
*H03K 19/00* (2006.01)
*H03K 19/173* (2006.01)

(52) U.S. Cl.
USPC .................................. 326/16; 326/46; 326/93

(58) Field of Classification Search
USPC .................. 326/37–41, 47, 101, 16, 46, 93
See application file for complete search history.

(56) References Cited

U.S. PATENT DOCUMENTS

| | | | |
|---|---|---|---|
| 6,420,903 B1 * | 7/2002 | Singh et al. | 326/93 |
| 6,691,268 B1 * | 2/2004 | Chin | 714/726 |
| 7,138,820 B2 * | 11/2006 | Goetting et al. | 326/9 |
| 7,230,445 B1 * | 6/2007 | Goetting et al. | 326/9 |
| 7,394,287 B1 * | 7/2008 | Hutton | 326/38 |
| 2005/0242836 A1 * | 11/2005 | Goetting et al. | 326/39 |
| 2008/0022173 A1 | 1/2008 | Chua-Eoan et al. | |
| 2008/0034192 A1 | 2/2008 | Lin et al. | |
| 2008/0290898 A1 * | 11/2008 | Hutton | 326/39 |

OTHER PUBLICATIONS

Shigematsu Satoshi et al: "A 1-V High-Speed MTCMOS Circuit Scheme for Power-Down Application Circuits" IEEE, Journal of Solid-State Circuits, vol. 32, No. 6, Jun. 1997, pp. 861-869.

Henzler Stephan et al: "Dynamic State-Retention Flip-Flop for Fine-Grained Power Gating with Small Design and Power Overhead" IEEE, Journal of Solid-State Circuits, vol. 41, No. 7, Jul. 2006, pp. 1654-1661.

Hosseinabady Mohammad et al: "A Selective Trigger Scan Architecture for VLSI Testing" IEEE, Transactions on Computers, vol. 57, No. 3, Mar. 2008, pp. 316-328.

Xiang Dong et al: "Improving Test Quality of Scan-Based BIST by Scan Chain Partitioning" IEEE, Proceedings of the 12th Asian Test Symposium, ATS 2003, pp. 12-18.

(Continued)

*Primary Examiner* — Thienvu Tran (57) ABSTRACT

A logic built-in self test (LBIST) system comprises a device under test having a first plurality of first bistable multivibrator circuits an LBIST controller, and a second plurality of second bistable multivibrator circuits. Each second bistable multivibrator circuit is coupled to a corresponding first bistable multivibrator circuit to swap a second state value kept by the second bistable multivibrator circuit with a first state value kept by the corresponding first bistable multivibrator circuit depending on a first control signal from the LBIST controller and the second bistable multivibrator circuits are coupled to form one or more scan chains when receiving a second control signal from the LBIST controller.

20 Claims, 4 Drawing Sheets

OTHER PUBLICATIONS

Chiu Min-Hao et al: "Jump Scan: A DFT Technique for Low Power Testing" IEEE, Proceedings of the 23rd IEEE VLSI Test Symposium, VTS 2005, pp. 277-282.

Mitra Subhasish et al: "Robust System Design with Built-In Soft-Error Resilience" IEEE, Computer Society, Feb. 2005, pp. 43-52.

Mutoh Shin'Ichiro et al: "A 1-V Multithreshold-Voltage CMOS Digital Signal Processor for Mobile Phone Application" IEEE, Journal of Solid-State Circuits, vol. 31, No. 11, Nov. 1996, pp. 1795-1802.

International Search Report and Written Opinion correlating to PCT/IB2008/054921 dated Sep. 4, 2009.

* cited by examiner

LOGIC BUILT-IN SELF-TEST SYSTEM AND METHOD FOR APPLYING A LOGIC BUILT-IN SELF-TEST TO A DEVICE UNDER TEST

FIELD OF THE INVENTION

This invention in general relates to integrated circuits (IC) and more specifically to a system for testing the internal digital functionality of an IC.

BACKGROUND OF THE INVENTION

Built-in self-test of semiconductor devices in-field gains importance because of higher quality and safety requirements. Because of this, the scope of design for test (DFT) methodologies implemented during chip development extends from production test to in-field test. In order to allow for testing a certain IC device, a built-in self-test (BIST) mechanism may be implemented within an IC. A BIST mechanism is a function that verifies all or a portion of the internal functionality of the IC device under test. Logic circuitry of an IC may be tested using a logic built-in self-test (LBIST) system. LBIST of digital semiconductor devices or sub-modules of it can be used for proving defect freeness of devices in a test environment and in the field. Highest defect coverage can be achieved by scan-based LBIST solutions.

Figure 1:
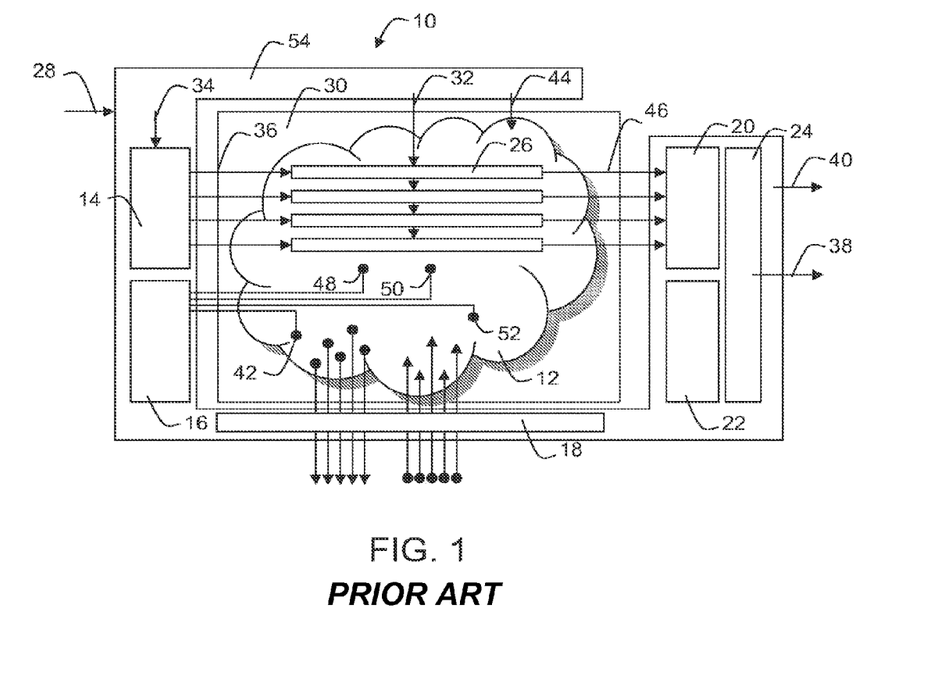
FIG. 1 schematically shows an example block diagram of a prior art LBIST system.

Referring to FIG. 1, a schematic diagram of an example of an LBIST system 10 is shown, comprising a device under test 30, which may be a complete IC or a partition thereof, having a core logic circuitry 12 to be tested and verified. An LBIST controller 54 may for example comprise a pseudo random pattern generator (PRPG) 14, a test point control signal generator 16, an isolation wrapper for functional core inputs and outputs (IOs) 18, a multiple input signature register (MISR) signature generator 20, a stored MISR signature 22, and a comparator 24.

Design for test for an LBIST architecture comprises the core logic circuitry of the device under test 30 being implemented using bistable multivibrator circuits operable to be connected in one or more scan chains 26. A bistable multivibrator circuit is a circuit that has two stable states and is thereby capable of serving as one bit memory. A bistable multivibrator circuit may for example be a flip-flop circuit or a latch. A scan chain is a shift register comprising bistable multivibrators. A "scan enable" signal 32 may be added to a logic circuitry design. When this signal is asserted by the LBIST controller 54, every bistable multivibrator in this design may be connected into a long shift register. However, a variation of this concept may include forming several scan chains for sub-sets of bistable multivibrator circuits instead of one single chain for all. An input 36 may be used for providing data to a scan chain and an output 46 may sequentially provide the state of every bistable multivibrator of the chain. Using the clock signal 44 of the chip, a test pattern may be entered into the chain of bistable multivibrator circuits. Suitable test patterns are generated using the pseudo random pattern generator (PRPG) 14 based on seed values 34 suitable for the device under test 30.

The basic mechanism may enable the LBIST controller by setting an "LBIST enable" signal 28, use a PRPG 14 to generate the input of a scan chain 26 of the device 30, shift test values into the device using the scan chains 26, initiate one or more functional cycles to get a response of the device and shift it into a MISR signature generator 20. The PRPG may for example generate the scan chain input values in advance or on the fly while shifting the values into the scan chains. The signature generator 20 may compress the captured response and generate a MISR signature. A comparison of the received signature with a stored good MISR signature 22 derived from the pseudo random pattern using comparator 24 may provide an information, whether or not the device under test comprises erroneous circuitry. A signal 38 indicating passing or failure and an end of test signal 40 may be generated. Additionally, a number of test points 42, 48, 50, 52 may for example be included in the device designed for test allowing the LBIST controller to apply control signals to the core logic under test using the test point signal generator 16 for controlling the behaviour of the device under test when processing the test pattern, hence influencing how the core logic is tested for erroneous behaviour. This may increase test coverage of potential defects, i.e. the detection ratio between potential defects which can be detected and number of total potential defects. The LBIST controller may for example be connected to an isolation wrapper 18 which may disconnect signal connections of the device under test, i.e. the tested core, from an (untested) rest of the device. This may avoid that the test and MISR signature are disturbed by core input signals with non-deterministic values. It may further prevent that any random output values of the core disturb the functionality of the rest of the device, which is not under test.

LBIST of digital semiconductor devices can be used to prove defect freeness of the device in the field, which is being installed within a product. High defect coverage can be achieved using scan-based LBIST solutions by applying certain sets of test patterns with respect to the control signals applied to certain test points, allowing for increased test coverage.

In order to apply a test pattern to the bistable multivibrator circuits of a scan chain 26, the core's normal functional operation is stopped for at least as many clock cycles as a scan chain comprises elements. However, since a better detection coverage of possible malfunctions may be desired, several test patterns may be applied, therefore stopping the application being executed on the device under test for a long time, for example more than the duration of a clock cycle times length of a scan chain times number of applied test patterns.

The described system does not keep the application context, i.e. the state values of the bistable multivibrator circuits before receiving the described test pattern may be lost, requiring restart of the device from a random or reset state.

SUMMARY OF THE INVENTION

The present invention provides a logic built-in self-test system and a method for applying a logic built-in self-test to a device under test as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Figure 2:
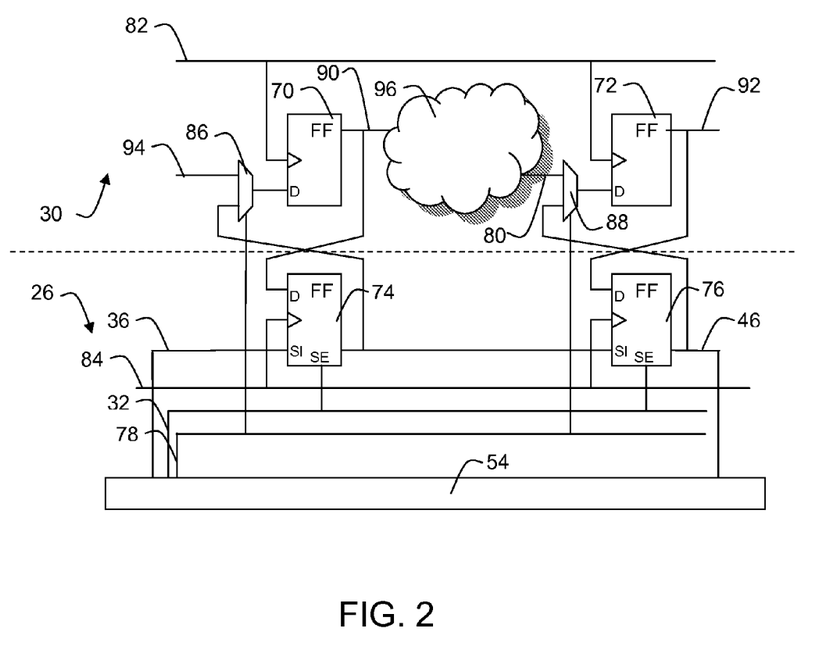
FIG. 2 schematically shows a diagram of an example of an embodiment of an LBIST system comprising pairs of flip-flop circuits.

Referring to FIG. 2, a schematic diagram of an example of an embodiment of an LBIST system comprising pairs of flip-flop circuits is illustrated and described also with reference to FIG. 1. The illustrated flip-flop circuits serve as examples for bistable multivibrators. As another example, latches may be used instead. A logic built-in self test (LBIST) system is shown, comprising a device under test 30 having a first plurality of first flip-flop circuits 70, 72, an LBIST controller 54, and a second plurality of second flip-flop circuits 74, 76. Each second flip-flop circuit 74, 76 is coupled to a corresponding first flip-flop circuit 70, 72 to swap a second state value kept by the second flip-flop circuit with a first state value kept by the corresponding first flip-flop circuit depending on a first control signal 78 from the LBIST controller. The second flip-flop circuits are coupled to form one or more scan chains 26 when receiving a second control signal 32 from the LBIST controller 54.

The device under test 30 comprises the first plurality of first flip-flop circuits 70, 72, may comprise application logic circuitry 96, and may be used for running an application, therefore continuously changing each or some of first state values or application state values, i.e. the state values held by some or all of the first flip-flop circuits or application flip-flop circuits 70, 72 of the device 30 receiving an application input signal 94, 80 from and providing an application output signal 90, 92 to an application logic 96. However, in order to save the application context, i.e. the plurality of application states kept by the plurality of application flip-flop circuits 70, 72, each application flip-flop circuit of the device under test 30 which is to be tested within this LBIST system 10 may be connected to a second flip-flop circuit or shadow flip-flop circuit 74, 76.

A shadow flip-flop circuit 74, 76 may for example be a flip-flop circuit additionally added for an application flip-flop circuit 70, 72 of a device under test 30. However, the device under test may cover a partition of an IC, and flip-flop circuits not part of the device under test but integrated in the same IC for the purpose of being used when executing an application may for example be used in an LBIST mode as shadow flip-flop circuits for application flip-flop circuits of the device under test. Vice versa, application flip-flop circuits of a device under test may for example serve as shadow flip-flop circuits of another device under test when in a second LBIST mode.

Referring to FIG. 2, the LBIST controller 54 may apply a first control signal or "exchange enable" signal 78 to a plurality of exchange circuits 86, 88 which may be implemented using multiplexers, connected to an input of the application flip-flop circuits 70, 72 and an output of the shadow flip-flop circuits 74, 76 causing each pair of application flip-flop circuits and shadow flip-flop circuits (70, 74), (72, 76) to swap or exchange values between each other. After swapping state values, shadow flip-flop circuits 74, 76 may contain the latest application context of the corresponding application flip-flop circuits 70, 72, whereas application flip-flop circuits 70, 72 may contain the second state values previously kept by the shadow flip-flop circuits 74, 76.

A signal, for example the first control signal 78, is to be understood as any physical quantity that can carry information from a source to a destination, for example from the LBIST controller 54 to an exchange circuit or a flip-flop circuit. It may comprise a single information transmitted to one or more destinations or more than one information transmitted to one or more destinations. In this sense, a signal may for example be regarded as a generic term that may comprise a plurality of sub-sets of sub-signals. For example, LBIST controller 54 may send one first control signal to all flip-flop circuits, or two or more than two, each of which lead to a sub-set of flip-flops circuits or connected exchange circuits.

The LBIST controller 54 may apply a second control signal or "scan enable" signal 32 to a dedicated "scan enable" input of each of the shadow flip-flop circuits 74, 76, causing a scan input of each shadow flip-flop circuit 76 to be connected with an output of a shadow flip-flop circuit 74 preceding in a scan chain 26, therefore coupling each of the shadow flip-flop circuits 74, 76 into one or more long shift registers or scan chains 26. Hence, the shadow flip-flop circuits 74, 76 and not the application flip-flop circuits 70, 72 may form one or more scan chains. To form a scan chain is to be understood as to operably connect as a scan chain, i.e. the shadow flip-flop circuits 74, 76 are in a mode of receiving a state value from a scan chain input and to provide their current state value to a scan input of a subsequent shadow flip-flop circuit. "Scan enable" 32 may be set by the LBIST controller 54 independently of any changes of state values of the application flip-flop circuits 70, 72, as long as "exchange enable" 78 does not trigger swapping state values of shadow flip-flop circuits and application flip-flop circuits. Typically, the LBIST controller 54 may set "scan enable" 32, write (or scan-in) data values into the shadow flip-flop circuits 74, 76 using the one or more scan chains 26 and may then set the "exchange enable" signal 78 for applying the data values to the application flip-flop circuits 72, 74. An additional "LBIST enable" 28 may be used for activating and deactivating LBIST functionality of the LBIST system. The LBIST controller 54 may be connected to the "scan in" input 36 of each beginning shadow flip-flop circuit 74 of a scan chain 26 and to each shadow flip-flop circuit 76 output connected to a "scan out" output 46 at the end of a scan chain and may be operable to write new state values into the shadow flip-flop circuits 74, 76 of a scan chain 26, control shifting of state values into and out of a scan chain and to read and evaluate the state values at the output of the shadow flip flop 76 at the end of a scan chain.

Basically, a bistable multivibrator circuit may be a memory cell storing one bit of information. Therefore, flip-flop circuits, latches and memory cells of memory chips, even memory cells of dynamic random access memories storing each bit using a transistor and a capacitor, may be within the scope of the described LBIST system.

A device under test 30 may comprise a complete IC chip. However, it may only comprise a core logic circuitry or a partition of all first or application bistable multivibrator circuits 70, 72. This may allow focussing the test layout on the chip partitions considered most important or safety specific for a desired application, hence limiting the amount of additional chip space used for implementing the shadow bistable multivibrator circuits.

In an example embodiment of the described LBIST system, the second flip-flop circuits or shadow flip-flop circuits 74, 76 may be state-retention flip-flops, enabling the LBIST system to store an application context in a power saving mode during a power off time where no or reduced power supply may be available.

And in order to allow swapping back the application context saved in the second or shadow flip-flop circuits 74, 76 and to receive the probably changed second state values previously applied to the first or application flip-flop circuits 70, 72, each second flip-flop circuit 74, 76 may be coupled to the corresponding first flip-flop circuit 70, 72 to swap the first state value kept by the second flip-flop circuit with the second state value kept by the corresponding first flip-flop circuit depending on the first control signal 78 from the LBIST controller 54. Because of this non-destructive approach to restoring the application context, the whole self-test may be transparent for an application being executed using the device under test 30.

Usually, a second or shadow flip-flop circuit 74, 76 may comprise one single flip-flop. However, in an embodiment of the described LBIST system, the second flip-flop circuit 74, 76 may comprise one flip-flop receiving and providing the first state value of the first flip-flop circuit 70, 72 to the first flip-flop circuit and another flip-flop providing and receiving the second state value from the first flip-flop circuit 70, 72. The plurality of first state values together are the application context saved from the first or application flip-flop circuits 70, 72 before being swapped with the second state values. Using two instead of one flip-flop for storing the first state value and the second state value within the second flip-flop circuit 74, 76 may allow for using state retention flip-flops for saving the application context and using conventional flip-flops for being part of the scan chain. If in an event of power off no application context is to be saved by the state retention flip-flops, both shadow flip-flops of a shadow flip-flop circuit may be disconnected from any power supply, hence saving standby power.

The second state values may be test values. According to the LBIST system shown in FIG. 1, an LBIST controller 54 may comprise a PRPG 14 for creating pseudo random test patterns to be applied to the shadow flip-flop circuits 74, 76 through the scan input 36 of a scan chain. After swapping these second state values as test stimulus values into the set of first flip-flop circuits or application flip-flop circuits 70, 72, and applying a first clock signal 82 to the application flip-flop circuits 70, 72, the second state values may have been changed by the application logic 96 of the device under test 30. Swapping back the probably changed second state values now representing test result values into the shadow flip-flop circuits 74, 76 and reading them into a MISR signature generator 20 may allow detection of a malfunction of the first flip-flop circuits 70, 72 or a malfunction of the application logic 96 by comparing the resulting MISR signature with a previously stored expected MISR signature 22. However, multiple test patterns may be applied: a process of creating test patterns, i.e. second state values being test stimulus values, shifting them into the shadow flip-flops 74, 76 through a scan chain, swapping them into the application flip-flop circuits 70, 72, applying a first clock signal 82 to application flip-flop circuits 70, 72, and swapping back the resulting tested second state values into the shadow flip-flop circuits 74, 76 may be performed many times before generating a resulting MISR signature and comparing it with a previously stored MISR signature.

In one embodiment of a described LBIST system, the second flip-flop circuits 74, 76, i.e. the shadow flip-flop circuits, may receive a second clock signal 84 having a clock frequency different from a first clock signal 82 received by the corresponding first flip-flop circuits 70, 72 or application flip-flop circuits. An application flip-flop circuit 70, 72 may be coupled to a first or application clock, whereas a second or shadow flip-flop circuit 74, 76 may be coupled to a second or shift clock. The second clock signal 84 may for example be zero when "scan enable" control signal 32 may not be applied. However, the frequency of the second clock signal 84 may for example be faster or slower than the first clock signal 82 triggering state changes of the first or application flip-flop circuits 70, 72. A second clock signal 84 faster than the first clock signal 82 may for example allow a faster loading of scan chains with new test stimulus second state values and reading of resulting test second state values.

And the clock frequency of the second clock signal 84 during reading or writing the scan chain 26 by the LBIST controller 54 may be independent from the first or application clock signal 82 and may even be variable, for example depending on the length of a test pattern to be inserted into a scan chain 26. A power consumption of the LBIST system may be adjusted by varying the second clock signal (84). For example, average power consumption of the LBIST system may be at least partly adjusted by adjusting the shift speed. Furthermore, peak power may be controlled by changing the second or shift clock signal 84 phase. For swapping state values between application flip-flop circuits 70, 72 and shadow flip-flop circuits 74, 76 for example a synchronous clock pulse of both first 82 and second 84 clock may be used.

However, the second flip-flop circuits 74, 76 may receive a second clock signal 84 having a clock frequency identical to a first clock signal 82 received by the corresponding first flip-flop circuits 70, 72. Supplying both pluralities of flip-flop circuits with clock signals having an identical clock frequency may help creating synchronous clock pulses when exchanging first and second state values between first and second flip-flop circuits. This embodiment may include provision of identical clock signals and applying no second clock signal. However, the term "identical" may be understood as having a no or only little jitter of clock frequency, for example not more than one clock cycle. In another example embodiment, the first and second clock signal 82, 84 may be created by the same clock generation circuit, thereby avoiding provision of two clock circuits.

In the described example embodiments of the LBIST system, a length of time for swapping each of the second state values with the first state values may be independent of the number of first flip-flop circuits 70, 72. Since first flip-flop circuits may not be part of a scan chain 26, the time for loading or reading scan chain shift registers 26, which is a function of the scan chain length, may not be coupled to the time for loading or unloading state values into/from the plurality of first flip-flop circuits 70, 72.

One or more of the corresponding first flip-flop circuits 70, 72 coupled to the second flip-flop circuits 74, 76 forming the one or more scan chains 26 may be operable to change the first state values during the same period of time when the LBIST controller 54 reads or writes the second state values of one or more of the second flip-flop circuits 74, 76 forming the scan chains 26.

Therefore, swapping second state values, i.e. test values, with first state values may not be performed for all pairs of first flip-flop circuits sequentially, but for example in parallel. Since first flip-flop circuits 70, 72 and second flip-flop circuits 74, 76 may receive clock signals independent from each other, an application being executed using first flip-flop circuits, i.e. application flip-flop circuits 70, 72, may only be stopped for the time for swapping test values into the application flip-flop circuits, executing test cycles and retrieving result test values from the application flip-flop circuits 70, 72. Therefore, the application may be stopped for only a few first clock cycles.

The number of first clock cycles needed for swapping second state values as test stimulus values into the application flip-flop circuits 70, 72 may for example be less than 10, and preferably 1 clock cycle. Accordingly, the number of first clock cycles needed for swapping probably changed second state values representing test result values from application flip-flop circuits 70, 72 into shadow flip-flop circuits 74, 76 may for example be less than 10, and preferably 1 clock cycle. In other words, a length of time for swapping each of the second state values with the first state values may be the time required for one clock cycle of the first clock signal 82. And the number of first clock cycles applied to application flip-flop circuits 70, 72 for self-test using the test pattern may be short, too, for example less than 100 clock cycles, and may be only 1 clock cycle. Hence, an application of a test pattern, i.e. second state values for test stimulus, to and reception of probably changed second state values representing test result values from the first plurality of first flip-flops 70, 72 may for example require not more than three clock cycles of a clock signal 82 applied to the first plurality of first flip-flop circuits 70, 72, i.e. the first or application flip-flop circuits 70, 72 may be used for testing during a minimum number of 3 clock cycles of the first clock signal. Apart from that period of time when the first flip-flop circuits contain the second state values, they may for example be used for executing an application or may be used for storing data.

In another embodiment, the LBIST system may additionally comprise exchange/control logic circuits having flip-flop circuits coupled to shadow flip-flop circuits themselves for LBIST.

The shown example embodiment of an LBIST system may comprise an LBIST controller with at least one of the one or more scan chains 26 having an input 36 coupled to an output of a pattern generator 14 of the LBIST controller 54 and an output 46 coupled to an input of a signature generator 20 of the LBIST controller 54. An LBIST controller according to the described system may comprise the components shown in FIG. 1. However, scan chains are formed from shadow flip-flop circuits 74, 76 instead of application flip-flop circuits 70, 72. In another embodiment the LBIST system may additionally comprise one or more scan chains comprising first or application flip-flop circuits.

The device under test 30 may be any device comprising logic circuitry. However, verification of functionality may be especially important for a device executing an application. Therefore, the device under test 30 may be a partition of a microcontroller unit. The partition may comprise all logic circuitry of the microcontroller unit. However, a partition may only cover certain fractions of the microcontroller unit considered important, safety specific or error-prone.

Figure 3:
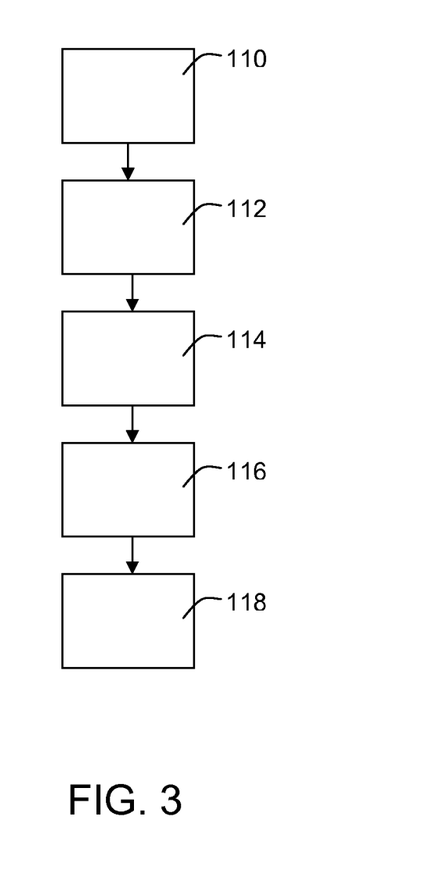
FIG. 3 schematically shows a flow diagram of an example of a method for applying a logic built-in self-test to a device under test.

Referring now to FIG. 3, a schematic flow diagram of an example of a method for applying a logic built-in self-test to a device under test is illustrated, with the device under test having a first plurality of first bistable multivibrator circuits 70, 72. The method may comprise writing 110 second state values into a second plurality of second bistable multivibrator circuits 74, 76, each second bistable multivibrator circuit 74, 76 coupled to a corresponding first bistable multivibrator circuit 70, 72, swapping 112 the second state values with first state values kept by the corresponding first bistable multivibrator circuits 70, 72, applying 114 the second state values kept in the first bistable multivibrator circuits 70, 72 to the device under test, which may comprise first bistable multivibrator circuits 70, 72 and application logic 96, and capturing a test result in the probably modified second state values in first bistable multivibrator circuits 70, 72 by applying a first clock signal 82 to the first bistable multivibrator circuits 70, 72, swapping 116 the second state values kept by the corresponding first bistable multivibrator circuits 70, 72 with the first state values kept by the second bistable multivibrator circuits 74, 76, and reading 118 the second state values kept by the second bistable multivibrator circuits 74, 76.

Writing 110 second state values into a second plurality of second bistable multivibrator circuits 74, 76 may for example comprise applying n pulses, with n being the length of the longest scan chain 26, of the second clock signal 84, i.e. of the shift clock signal, and shifting in test patterns, i.e. second state values for test stimulus into shadow bistable multivibrator circuits 74, 76 while an application may continue running using the first bistable multivibrator circuits 70, 72. Afterwards the application may be stopped by stopping the application clock signal 82.

In an embodiment of the method, swapping 112 the second state values with first state values kept by the corresponding first bistable multivibrator circuits 70, 72 may for example comprise exchanging values between pairs of application/shadow bistable multivibrator circuits by asserting the "exchange enable" first control signal 78 and at least one synchronous pulse of the first or application clock 82 and second or shift clock 84, saving the application context in the shadow bistable multivibrators 74, 76 and putting the test pattern into the application bistable multivibrators 70, 72 of the device under test 30.

Applying 114 the second state values kept in the first bistable multivibrator circuits 70, 72 to the device under test and capturing a test result in the second state values by applying a first clock signal 82 to the first bistable multivibrator circuits 70, 72 may for example comprise applying the test pattern or test vector, i.e. second state values for test stimulus to the application logic 96 of the device under test and capturing test response in second bistable multivibrator circuits 74, 76 by pulsing the application clock 82 once.

Swapping 116 the second state values kept by the corresponding first bistable multivibrator circuits 70, 72 with the first state values kept by the second bistable multivibrator circuits 74, 76 may for example comprise exchanging values between pairs of application/shadow bistable multivibrator circuits by asserting an "exchange enable" first control signal 78 and at least one synchronous pulse of application clock 82 and shift clock 84. This may restore the application context in the application bistable multivibrator circuits and may put the test results, i.e. the probably changed second state values representing the test result values, into the one or more shadow scan chain.

Afterwards, the application may be restarted from the point of stopping by restarting application clock pulses on clock signal 82.

Reading 118 the second state values kept by the second bistable multivibrator circuits 74, 76 may for example comprise applying n shift clock pulses and shifting out test results from scan chains 26 into conventional LBIST signature registers while the application may already be running again. Writing 110 second state values into a second plurality of second bistable multivibrator circuits 74, 76 and reading 118 may be performed concurrently by same clock pulses applied to second bistable multivibrator circuits 74, 76.

The illustrated method allows implementing the advantages and characteristics of the described logic built-in self-test system as part of a method for applying a logic built-in self-test to a device under test.

Figure 4:
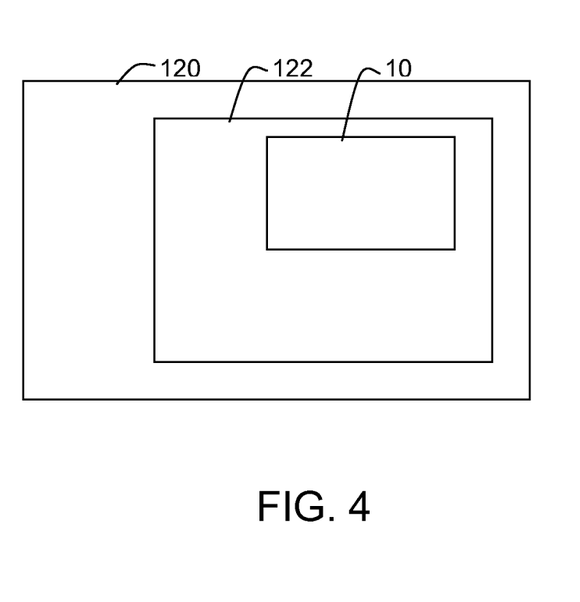
FIG. 4 schematically shows a block diagram of an example of a vehicle comprising a safety critical system and an LBIST system.

Referring now also to FIG. 4, a schematic block diagram of an example of a vehicle 120 comprising a safety critical system 122 and an LBIST system 10 is shown. Devices used as part of a safety critical system 122 may for example comply with safety standards like IEC61508.

A safety critical system 122, i.e. a system used in an environment where safety and avoidance of system failure is a critical issue, may comprise a logic built-in self-test (LBIST) system 10 or using a method as described above. Since the presented LBIST system provides a mechanism of detecting device malfunction, the system or the corresponding method may be used in safety critical environments, where device failure or system freezing may result in a dangerous situation. A safety critical system 122 may be found, for example, in an automotive environment and may be, for example, a vehicle safety system. A safety critical system may for example comprise a brake system or an electrical steering system or it may be used for vehicle chassis or powertrain applications. Therefore, a vehicle 120 may comprise a safety critical system 122 or an LBIST system 10 or may use a method as described above. A vehicle 120 may be a car. However, it may be any automotive apparatus, such as a plane, a ship, a helicopter etc.

Furthermore, a computer program product may comprise code portions for executing steps of a method or for implementing parts of an LBIST system as described above when run on a programmable apparatus. Just to give a few examples, the LBIST controller may at least partly be implemented as a software solution or the LBIST system may be implemented as part of a software simulation. Another example illustrating that many combined software and hardware architectures are possible and within the scope of the shown system and method comprises the LBIST being triggered by software, executed in hardware, and LBIST result then being checked by software (e.g. comparing MISR signature with expected value) once the hardware indicates completion of test to software.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be apparent that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, at least portions of the system 10 may be implemented using a programmable logic device (PLD), e.g. a field programmable gate array (FPGA), an application specific integrated circuit (ASIC) etc., or as a program code executable by a processing device, such as a digital signal processor (DSP), a microcontroller unit (MCU), a general purpose processor (GPP), a central processing unit (CPU) etc.

The terms "assert" or "set" are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, LBIST controller 54 may be located on a same integrated circuit as the device under test 30 or on a separate integrated circuit or located within another peripheral discretely separate from other elements of system 10. Also for example, system 10 or portions thereof may be soft or code representations of physical circuitry or of logical representations convertible into physical circuitry. As such, system 10 may be embodied in a hardware description language of any appropriate type.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A logic built-in self test system, comprising
 a device under test having a first plurality of first bistable multivibrator circuits;
 a logic built-in self test (LBIST) controller; and
 a second plurality of second bistable multivibrator circuits,
  each second bistable multivibrator circuit coupled to a corresponding first bistable multivibrator circuit and configured to swap a second state value kept by said second bistable multivibrator circuit with a first state value kept by said corresponding first bistable multivibrator circuit in response to a first control signal from said LBIST controller, and
  said second bistable multivibrator circuits coupled to form one or more scan chains when receiving a second control signal from said LBIST controller, wherein said second bistable multivibrator circuits are further configured to receive a second clock signal, the second clock signal different from a first clock signal received by said corresponding first bistable multivibrator circuits.

2. The LBIST system as claimed in claim 1 further comprising:
 each second bistable multivibrator circuit is further coupled to said corresponding first bistable multivibrator circuit to swap said first state value kept by said second bistable multivibrator circuit with said second state value kept by said corresponding first bistable multivibrator circuit in response to said first control signal from said LBIST controller.

3. The LBIST system as claimed in claim 2, wherein said second bistable multivibrator circuit comprises:
 a first bistable multivibrator receiving and providing said first state value of said first bistable multivibrator circuit to said first bistable multivibrator circuit; and
 a second bistable multivibrator providing and receiving said second state value from said first bistable multivibrator circuit.

4. The LBIST system as claimed in claim 1, wherein said second bistable multivibrator circuit comprises:
 a first bistable multivibrator receiving and providing said first state value of said first bistable multivibrator circuit to said first bistable multivibrator circuit; and
 a second bistable multivibrator providing and receiving said second state value from said first bistable multivibrator circuit.

5. The LBIST system as claimed in claim 1, wherein said second state values comprise test values.

6. The LBIST system as claimed in claim 1, wherein a frequency of the second clock signal is different than a frequency of the first clock signal.

7. The LBIST system as claimed in claim 6, wherein a power consumption of said LBIST system is adjusted by varying said frequency of the second clock signal.

8. The LBIST system as claimed in claim 6, wherein a length of time for swapping each of said second state values with said first state values is the time required for one clock cycle of said first clock signal.

9. The LBIST system as claimed in claim 1, a frequency of the second clock signal and a frequency of the first clock signal are the same.

10. The LBIST system as claimed in claim 1, wherein a length of time for swapping each of said second state values with said first state values is independent of the number of first bistable multivibrator circuits.

11. The LBIST system as claimed in claim 1, wherein one or more of said corresponding first bistable multivibrator circuits coupled to said second bistable multivibrator circuits forming said one or more scan chains are operable to change said first state values during a same period of time as said LBIST controller reads or writes said second state values of one or more of said second bistable multivibrator circuits forming said scan chains.

12. The LBIST system as claimed in claim 1 further comprising:
 a pattern generator of said LBIST controller; and
 a signature generator of said LBIST controller, wherein
  at least one of said one or more scan chains comprises an input coupled to an output of the pattern generator of said LBIST controller and an output coupled to an input of the signature generator of said LBIST controller.

13. The LBIST system as claimed in claim 1, wherein said device under test is a partition of a microcontroller unit.

14. A method for applying a logic built-in self-test to a device under test having a first plurality of first bistable multivibrator circuits, the method comprising:
 writing second state values into a second plurality of second bistable multivibrator circuits, each second bistable multivibrator circuit coupled to a corresponding first bistable multivibrator circuit;
 receiving a second clock signal at the second bistable multivibrator;

swapping said second state values with first state values kept by said corresponding first bistable multivibrator circuits;

applying said second state values kept in said first bistable multivibrator circuits to said device under test;

capturing a test result in said second state values by applying a first clock signal to said first bistable multivibrator circuits, the first clock signal different from the second clock signal;

swapping said second state values kept by said corresponding first bistable multivibrator circuits with said first state values kept by said second bistable multivibrator circuits; and reading said second state values kept by said second bistable multivibrator circuits.

15. A safety critical system, comprising a logic built-in self-test (LBIST) system as claimed in claim 1.

16. A vehicle comprising the safety critical system as claimed in claim 15.

17. The method of claim 14:

wherein the second clock signal comprises a frequency different from the first clock signal.

18. The method of claim 17 further comprising:

adjusting a power consumption of said logic built-in self-test system by adjusting said frequency of the second clock signal.

19. The method of claim 14 wherein said second state values comprise test values.

20. A non-transitory computer-readable storage medium storing instructions executable by a processor and configured to:

write second state values into a second plurality of second bistable multivibrator circuits, wherein each second bistable multivibrator circuit is coupled to a corresponding first bistable multivibrator circuit;

receive a second clock signal at the second bistable multivibrator;

swap said second state values with first state values kept by said corresponding first bistable multivibrator circuits;

apply said second state values kept in said first bistable multivibrator circuits to a device under test;

capture a test result in said second state values by applying a first clock signal to said first bistable multivibrator circuits, the first clock signal different from the second clock signal;

swap said second state values kept by said corresponding first bistable multivibrator circuits with said first state values kept by said second bistable multivibrator circuits; and read said second state values kept by said second bistable multivibrator circuits.

* * * * *